United States Patent
An et al.

[11] Patent Number: 6,051,470
[45] Date of Patent: Apr. 18, 2000

[54] DUAL-GATE MOSFET WITH CHANNEL POTENTIAL ENGINEERING

[75] Inventors: Judy X. An, San Jose; Bin Yu, Santa Clara, both of Calif.

[73] Assignee: Advanced Micro Devices, Inc., Sunnyvale, Calif.

[21] Appl. No.: 09/231,651

[22] Filed: Jan. 15, 1999

[51] Int. Cl.[7] .................................................. H01L 21/336
[52] U.S. Cl. .......................... 438/283; 438/163; 438/197; 438/267; 438/289; 438/304; 438/585
[58] Field of Search .................................... 438/163, 197, 438/301, 303, 304, 585, 595, 596, 267, 283, 289; 257/368

[56] References Cited

U.S. PATENT DOCUMENTS

| | | | |
|---|---|---|---|
| 5,168,072 | 12/1992 | Moslehi | 438/300 |
| 5,324,673 | 6/1994 | Fitch et al. | 438/156 |
| 5,324,960 | 6/1994 | Pfiester et al. | 257/67 |
| 5,358,879 | 10/1994 | Brady et al. | 438/163 |
| 5,480,820 | 1/1996 | Roth et al. | 438/257 |
| 5,498,889 | 3/1996 | Hayden | 257/301 |
| 5,633,781 | 5/1997 | Saenger et al. | 257/296 |
| 5,869,374 | 2/1999 | Wu | 438/291 |

Primary Examiner—Carl Whitehead, Jr.
Assistant Examiner—Maria Guerrero

[57] ABSTRACT

A semiconductor device with reduced hot carrier injection and punch through is formed with a dual gate electrode comprising edge conductive portions, a central conductive portion, and dielectric sidewall spacers formed between the edge conductive portions and central conductive portion. The edge conductive portions provide high potential barriers against the active regions, thereby reducing threshold voltage roll off and leakage current.

9 Claims, 3 Drawing Sheets

DUAL-GATE MOSFET WITH CHANNEL POTENTIAL ENGINEERING

FIELD OF THE INVENTION

The present invention relates generally to a semiconductor device comprising transistors, and to a method of manufacturing the semiconductor device. The present invention has particular applicability in manufacturing a Metal Oxide Semiconductor Field Effect Transistor (MOSFET) device exhibiting high-speed performance and high reliability.

BACKGROUND ART

Increased integration density requires semiconductor devices having increasingly miniaturized features. As gate lengths are reduced, problems such as short channel effects are encountered. For example, "punch through" arises when the drain voltage reaches a sufficiently large value, and the depletion layer associated with the drain spreads across the substrate and reaches the source, thereby enabling the charge carriers in the drain to punch through to the source and increasing leakage current significantly. Large amount of "punch through" charge carriers may deteriorate a transistor's function completely even with sufficient gate voltage to turn off the channel, resulting in complete loss of its controllability as a switch. In addition, "hot carrier injection" arises when device dimensions are reduced but the supply voltage is maintained, thereby increasing the electric field generated in the silicon substrate. Such an increased electric field enables electrons in the channel region to gain sufficient energy to be injected onto the gate oxide, resulting in device degradation.

There exists a need for semiconductor methodology and devices exhibiting improved short channel characteristics with reduced punch through and hot carrier injection.

DISCLOSURE OF THE INVENTION

An advantage of the present invention is a semiconductor device exhibiting improved short channel characteristics, such as reduced punch through and hot carrier injection.

Another advantage of the present invention is a simplified method of manufacturing a semiconductor device exhibiting improved short channel characteristics.

Additional advantages and other features of the present invention will be set forth in part in the description which follows and in part will become apparent to those having ordinary skill in the art upon examination of the following or may be learned from the practice of the present invention. The objectives and advantages of the present invention may be realized and obtained as particularly pointed out in the appended claims.

According to the present invention, the foregoing and other advantages are achieved in part by a semiconductor comprising: a substrate; source/drain regions in the substrate with a channel region therebetween; a gate dielectric layer on the substrate overlying the channel region; and a gate electrode on the gate dielectric layer, the gate electrode comprising: a central conductive portion having side surfaces; dielectric sidewall spacers on the side surfaces of the central portion; and edge conductive portions on the sidewall spacers.

Another aspect of the present invention is a method of manufacturing a semiconductor device, the method comprising: forming a gate oxide layer on a main surface of a substrate; forming source/drain regions in the substrate with a channel region between the source/drain regions and under the gate oxide layer; forming an oxide layer on the substrate, the oxide layer having an opening therein, the opening having side surfaces and a lower portion over the channel region, and a gate oxide layer across the lower portion of the opening; and forming a gate electrode on the gate oxide layer by: forming edge conductive portions laterally on the side surfaces of the opening; forming dielectric sidewall spacers laterally on exposed side surfaces of the edge conductive portions; and forming a central conductive portion between the dielectric sidewall spacers.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

BRIEF DESCRIPTION OF THE DRAWINGS

In FIG. 1 to FIG. 12, similar features are denoted by similar reference numerals.

DESCRIPTION OF THE INVENTION

The present invention enables manufacturing semiconductor devices exhibiting improved short channel effects by strategically structuring the gate electrode such that a higher potential barrier is formed at the edges of the gate electrode, thereby preventing electrons in the drain region from spreading across the semiconductor and reaching a source region or being injected onto a gate oxide. Accordingly, the present invention provides semiconductor devices with reduced withstand voltage roll off and punch through.

Figure 12:
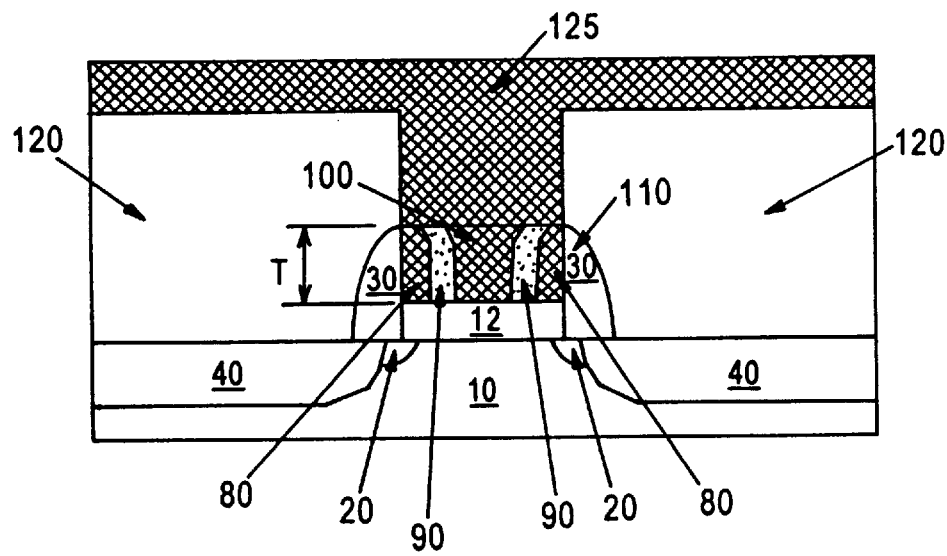

The present invention achieves that objective by forming a dual gate electrode. As shown in FIG. 12, an embodiment of the present invention comprises a gate electrode 110, comprising edge conductive portions 80 and a central conductive portion 100. Dielectric sidewall spacers 90 are formed on both side surfaces of the central conductive portion 100.

The edge conductive portions 80 are formed of a material, such that they have a higher withstand voltage than the withstand voltage of the central conductive portion 100. Therefore, when gate voltage is supplied to both edge conductive portions and central conductive portion, higher potential barriers are formed at the substrate underlying the edge conductive portions 80 than at the substrate underlying the central conductive layer 100. The potential barriers formed under the edge conductive portions 80 effectively reduce punch through between source/drain regions 40 including lightly doped extensions 20. Similarly, hot electron injection is also reduced by the higher potential barrier formed under the edge conductive portions 80. Thus, improved short channel characteristics are achieved by the present invention.

Given the disclosed objectives and guidance herein, optimum materials and dimensions of the gate electrode structure can be determined for a particular situation. For example: the edge conductive portions 80 can comprise titanium nitride, aluminum, tungsten, or titanium, formed at a width of about 100 Å to 500 Å; the dielectric sidewall spacers 90 can comprise silicon nitride or silicon oxide formed at a width of about 50 Å to 500 Å; and the central conductive portion 100 comprising polysilicon or polysilicon germanium ($Si_{1-x}Ge_x$ with x=0.2 to 0.5) formed at a width of about 400 Å to about 1000 Å. The entire gate structure can have a thickness of about 1000 Å to 2500Å.

Embodiments of the present invention also comprise sidewall spacers 30 formed on both side surfaces of the gate electrode 110 and the gate oxide 12. As shown in FIG. 12, active regions 40, e.g., source and drain regions, are formed in the surface portion of the silicon substrate 10 and lightly doped active region extensions 20, e.g., shallow source/drain extensions, are formed in the surface of the substrate underlying the edge conductive portions 80. A channel region is formed between the light doped active region extensions 20.

Figure 1:
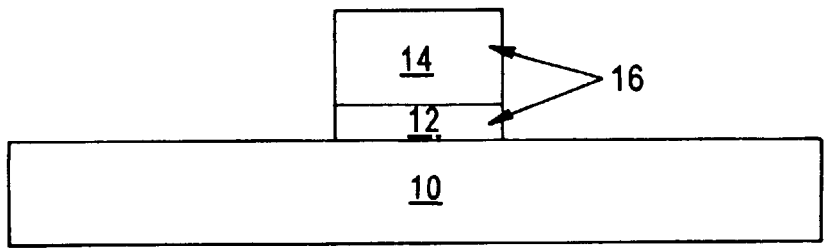
FIG. 1 to FIG. 12 illustrate sequential phases of a method according to an embodiment of the present invention.

An embodiment of a method in accordance with the present invention is schematically illustrated commencing with the intermediate fabrication stage as shown in FIG. 1. First dielectric layer 12, e.g., an oxide layer, is formed at a suitable thickness, e.g., about 20 Å to about 100 Å, as by conventional thermal oxidation, on the main surface of semiconductor substrate 10. Conductive layer 14, e.g., a polysilicon layer, is formed on the first dielectric layer 12. The oxide layer 12 and conductive layer 14 constitute a temporary gate structure 16 subsequent to patterning by conventional photolithographic and etching as shown in FIG. 1.

Figure 2:
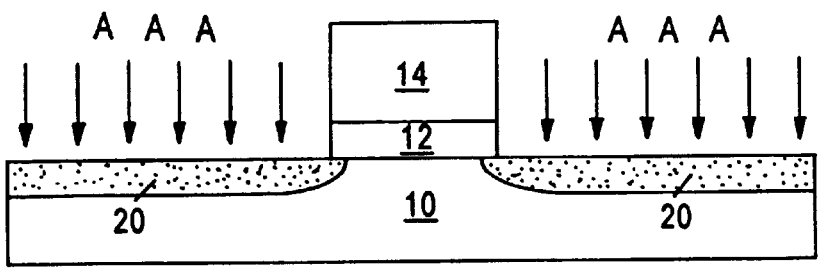
Figure 3:
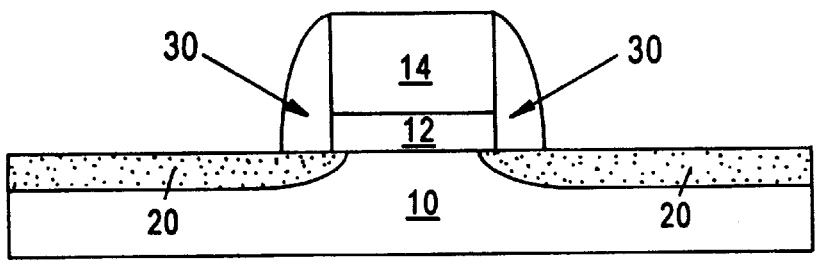
Figure 4:
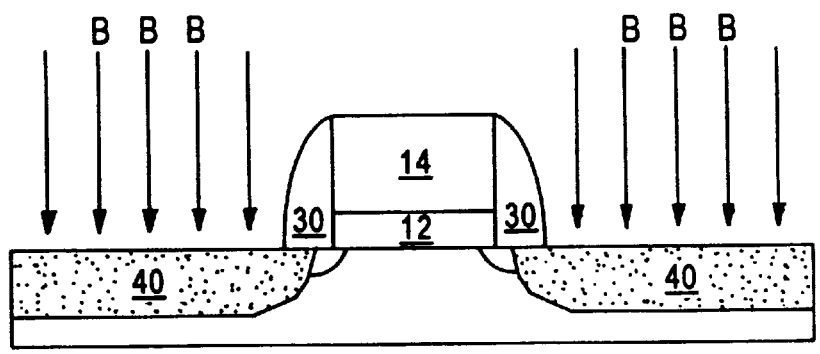

As shown in FIG. 2, lightly doped shallow source/drain extensions 20 are formed by ion implanting n-type or p-type impurities, as shown by arrows A, into the surface of the semiconductor substrate 10, employing the temporary gate structure 16 as a mask. Then, sidewall spacers 30 are formed on the side surface of the temporary gate structure 16, as shown in FIG. 3. N-type or p-type impurities are then ion implanted, as shown by arrows B, to form source/drain region 40 in the surface of the semiconductor substrate 10, as shown in FIG. 4.

Figure 5:
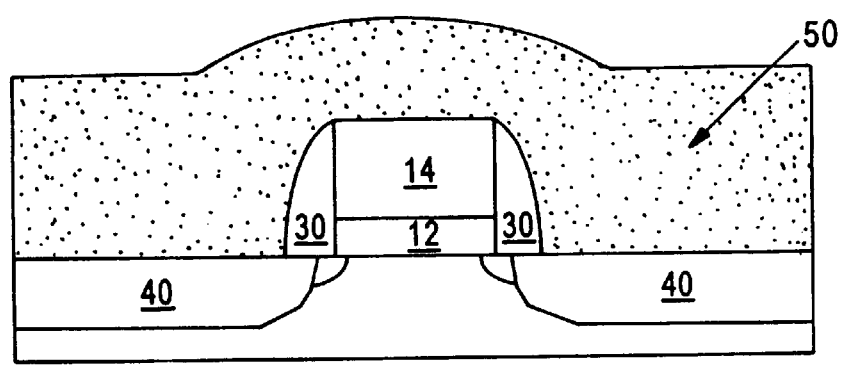
Figure 6:
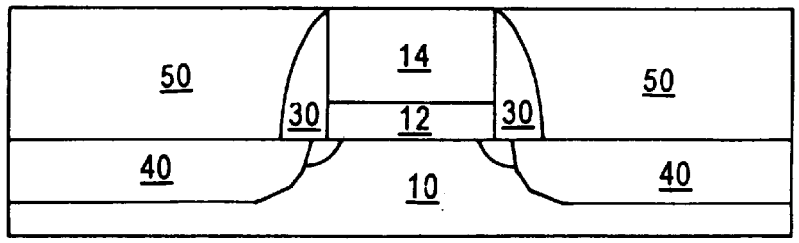
Figure 7:
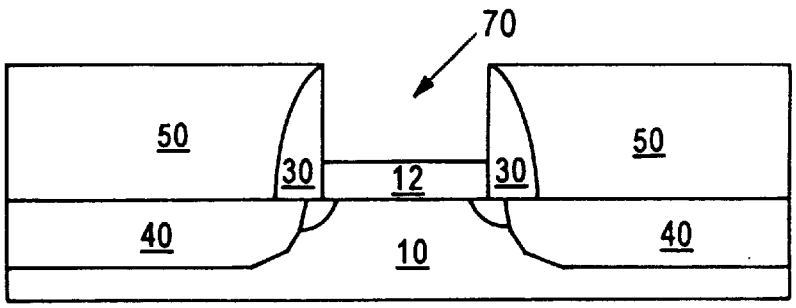

A second dielectric layer 50, is then formed, typically by chemical vapor deposition or a spin on technique, on substrate 10, covering the sidewall spacers 30 and temporary gate structure 16, as shown in FIG. 5. Then, the surface of the second dielectric layer 50 is planarized, as by chemical mechanical polishing, as shown in FIG. 6, exposing the top surface of the temporary gate structure 16. The conductive layer 14 is then removed, as by etching, as shown in FIG. 7, thereby forming an opening 70 between the sidewall spacers 30, exposing the oxide layer 12.

Figure 8:
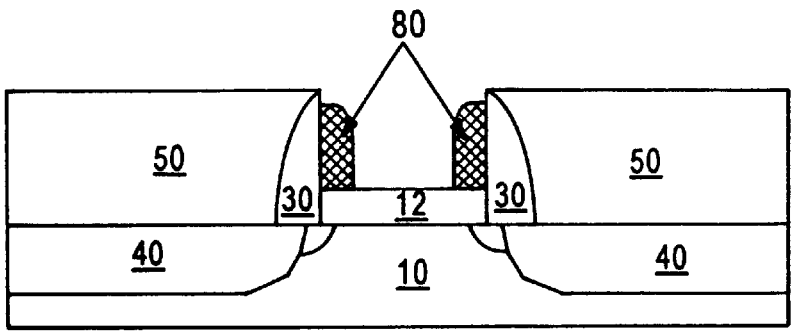

Subsequent to removing the conductive layer 14, edge conductive portions 80 are then laterally formed on the exposed side surfaces of the sidewall spacers 30 and the upper surfaces of each edge of the oxide dielectric layer 12 in the opening 70, as shown in FIG. 8. Edge conductive portions 80 are formed by depositing a metal layer, e.g., titanium nitride, aluminum, tungsten, or titanium as at the width of about 100 Å to about 500 Å. Edge conductive portions 80 provide a higher potential barrier, e.g., about 0.3 eV to about 1 eV, than the potential barrier of polycrystalline silicon conventionally used as a gate electrode material. Edge conductive portions 80 can be formed by controlled sputtering or by depositing a conformal layer and anisotropically etching.

Figure 9:
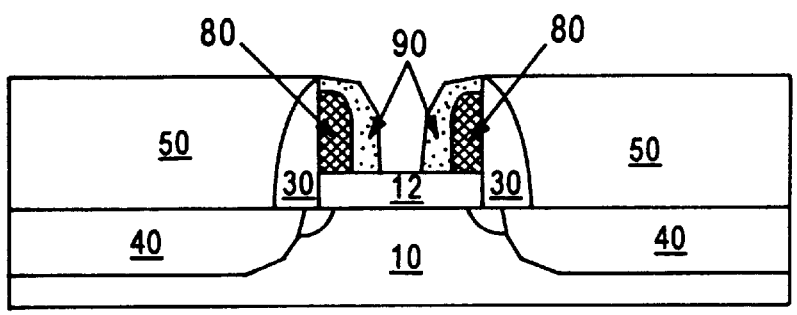

Dielectric sidewall spacers 90 are formed on the edge conductive portion 80, as shown in FIG. 9. Dielectric sidewall spacers 90 can be formed by depositing a dielectric layer, e.g., silicon nitride or silicon oxide as at the width of about 50 Å to about 500 Å. Dielectric sidewall spacers 90 can be formed in a conventional manner as by depositing a conformal layer and anisotropically etching.

Figure 10:
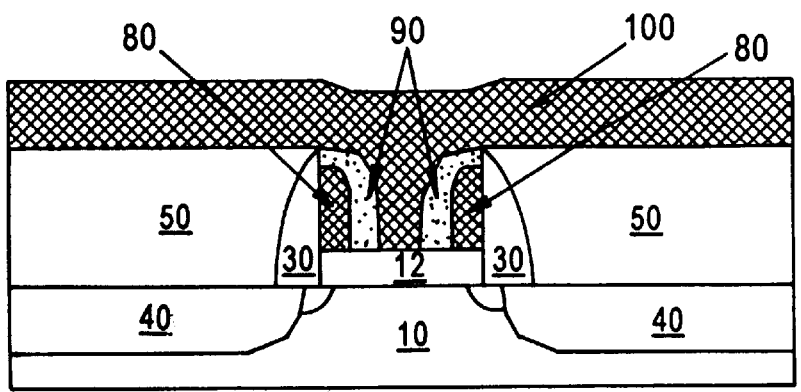
Figure 11:
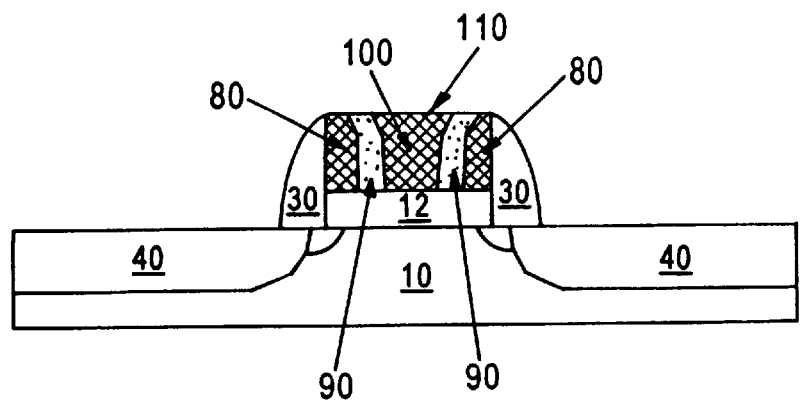

As shown in FIG. 10, a central conductive portion 100 is then formed, as at the width of about 400 Å to about 1000 Å, by depositing a polycrystalline silicon layer or polysilicon germanium ($Si_{1-x}Ge_x$ with x=0.2 to 0.5), filling the remaining space of opening 70 between the dielectric sidewall spacers and on the upper surface of the oxide dielectric layer 12. The resulting dual gate electrode 110 comprises, as shown in FIG. 11, the polycrystalline silicon central conductive portion 100, metal edge conductive portions 80, and silicon nitride dielectric sidewall spacers 90 formed between the edge conductive portions 80 and central conductive portion 100.

Embodiments of the present invention also comprise planarizing, as by chemical mechanical polishing. As shown in FIG. 11, the surface of the second dielectric layer 50, edge conductive portions 80, dielectric sidewall spacers 90, and central conductive portion 100 are planarized. Then, second dielectric layer 50 is removed leaving sidewall spacers 30 on the side surfaces of edge conductive portions 80 as shown in FIG. 12.

As shown in FIG. 12, third dielectric layer 120 is formed, typically by chemical vapor deposition or a spin on technique, on substrate 10 and gate electrode 110. The gate control terminal 125 is then connected to both edge conductive portions 80 and core conductive portion 100 of the dual gate electrode 110. Since the edge conductive portions 80 have a higher withstanding voltage, higher potential barriers are formed at the substrate underlying the edge conductive portion 80 than the substrate underlying the central conductive layer 100. The potential barrier formed under the edge conductive portions 80 reduces the number of punch through carriers between the source/drain region 40, including lightly doped active regions 20, when sufficiently large voltage value is applied to the dual gate electrode 110. Accordingly, improved short channel characteristics are achieved by the present invention.

The present invention is applicable to the production of various types of semiconductor devices. The present invention is particularly applicable to high-density semiconductor devices having a design rule of about 0.18 microns and under, exhibiting high-speed characteristics and improved reliability.

Embodiments of the present invention involve the use of conventional materials and methodology to form various components of a transistor and semiconductor device. For example, the semiconductor substrate employed in the embodiment of the present invention typically comprises doped monocrystalline silicon and the dielectric layer typically comprises silicon oxide. In the previous description, numerous specific details are set forth such as specific material, structure, chemicals, process, etc., in order to provide a through understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modification within the scope of the inventive concept as expressed herein.

What is claimed is:

1. A method of manufacturing a semiconductor device, the method comprising:

forming a gate oxide layer on a main surface of a substrate;

forming source/drain regions in the substrate with a channel region between the source/drain regions and under the gate oxide layer;

forming a dielectric layer on the substrate, the dielectric layer having an opening therein, the opening having side surfaces and a lower portion over the channel region, and the gate oxide layer across the lower portion of the opening; and forming a gate electrode on the gate oxide layer within the opening by:

forming edge conductive portions of the gate electrode laterally on the side surfaces of the opening;

forming dielectric sidewall spacers laterally on exposed side surface of the edge conductive portions; and forming a central conductive portion of the gate electrode between the dielectric sidewall spacers.

2. The method according to claim 1, comprising forming the edge portions at a lateral thickness of about 100 Å to about 500 Å.

3. The method according to claim 1, comprising forming the dielectric sidewall spacers at a lateral thickness of about 50 Å to about 500 Å.

4. The method according to claim 1, comprising forming the central portion at a lateral thickness of 400 Å to about 1000 Å.

5. The method according to claim 1, wherein the step of forming the dielectric layer having the opening therein comprising:

forming a conductive layer on the gate oxide layer;

forming the dielectric layer on the substrate and the conductive layer;

planarizing the dielectric layer, exposing the conductive layer; and removing the conductive layer, forming the opening having the side surfaces and the lower portion over the channel region.

6. The method according to claim 1, further comprising planarizing after forming the gate electrode.

7. The method according to claim 5, comprising ion implanting impurities using the conductive layer and gate oxide layer as a mask to form the source/drain regions.

8. The method according to claim 7, comprising:

ion implanting impurities, using the conductive layer and gate oxide as a mask, to form shallow source/drain extensions;

forming sidewall spacers on side surfaces of the conductive layer and the gate oxide layer; and implanting impurities, using the conductive layer, the gate oxide layer, and the sidewall spacers as a mask, to form the source/drain regions.

9. The method according to claim 6, comprising planarizing by etching back or chemical mechanical polishing.

* * * * *